US011658381B2

(12) United States Patent
Li et al.

(10) Patent No.: US 11,658,381 B2
(45) Date of Patent: May 23, 2023

(54) SINGLE QUAD-MODE DIELECTRIC RESONATOR HAVING INTERSECTING MICROSTRIP LINES COUPLED TO SWITCHING CIRCUITRY AND SELECTIVELY CONFIGURED FOR DUAL-BAND TRANSMISSION/ISOLATION

(71) Applicant: South China University of Technology, Guangzhou (CN)

(72) Inventors: Yuanchun Li, Guangzhou (CN); Disi Wu, Guangzhou (CN); Quan Xue, Guangzhou (CN)

(73) Assignee: South China University of Technology, Guangzhou (CN)

( * ) Notice: Subject to any disclaimer, the term of this patent is extended or adjusted under 35 U.S.C. 154(b) by 0 days.

(21) Appl. No.: 17/523,935

(22) Filed: Nov. 11, 2021

(65) Prior Publication Data

US 2023/0117966 A1    Apr. 20, 2023

(30) Foreign Application Priority Data

Oct. 18, 2021 (CN) .......................... 202111209934.2

(51) Int. Cl.
| | |
|---|---|
| *H01P 7/10* | (2006.01) |
| *H01P 1/20* | (2006.01) |
| *H01P 3/08* | (2006.01) |
| *H05K 1/14* | (2006.01) |
| *H05K 9/00* | (2006.01) |
| *H05K 1/02* | (2006.01) |
| *H01P 1/15* | (2006.01) |

(Continued)

(52) U.S. Cl.
CPC ............... *H01P 7/105* (2013.01); *H01P 1/15* (2013.01); *H01P 1/20* (2013.01); *H01P 1/2086* (2013.01); *H01P 3/081* (2013.01); *H05K 1/0237* (2013.01); *H05K 1/14* (2013.01); *H05K 9/0024* (2013.01); *H04L 5/14* (2013.01)

(58) Field of Classification Search
CPC .... H01P 1/2086; H01P 7/105; H01P 1/20309; H01P 1/15
USPC ......................................................... 333/202
See application file for complete search history.

(56) References Cited

U.S. PATENT DOCUMENTS

| | | |
|---|---|---|
| 8,111,115 B2 | 2/2012 | Mansour et al. |
| 9,287,601 B2 | 3/2016 | Yin et al. |

(Continued)

*Primary Examiner* — Benny T Lee
(74) *Attorney, Agent, or Firm* — True Shepherd LLC; Andrew C. Cheng (57) ABSTRACT

A dual-band filtering switch based on a single quad-mode dielectric resonator (DR) includes: a first printed circuit board (PCB) provided thereon with an input terminal; a second PCB provided thereon with an output terminal; a shielding shell arranged between the first and second PCBs and enclosing a shielding cavity together with the first and second PCBs; and a single quad-mode DR arranged in the shielding cavity. The first and second PCBs each include a feeding layer, a dielectric layer, and a ground layer that are stacked in sequence. The feeding layers of the first and second PCBs each include a microstrip line and a switching circuitry connected to the microstrip line, and the feeding layer is in contact with a surface of the DR to realize a switching function of the filtering switch. The proposed filtering switch feature low loss transmission and high selectivity with dual-band operation, miniaturization with the fewest resonators and friendly-integration, simultaneously.

10 Claims, 8 Drawing Sheets

(51) Int. Cl.
*H01P 1/208* (2006.01)
*H04L 5/14* (2006.01)

(56) References Cited

U.S. PATENT DOCUMENTS

| | | |
|---|---|---|
| 10,033,084 B2 | 7/2018 | Li et al. |
| 2010/0013578 A1* | 1/2010 | Memarian et al. ... H01P 1/2086 333/219.1 |
| 2022/0231395 A1* | 7/2022 | Tada et al. ............ H01P 1/2053 |

\* cited by examiner

SINGLE QUAD-MODE DIELECTRIC RESONATOR HAVING INTERSECTING MICROSTRIP LINES COUPLED TO SWITCHING CIRCUITRY AND SELECTIVELY CONFIGURED FOR DUAL-BAND TRANSMISSION/ISOLATION

CROSS-REFERENCE TO RELATED APPLICATIONS

This application claims priority to Chinese Patent Application No. 202111209934.2 with a filing date of Oct. 18, 2021. The content of the aforementioned application, including any intervening amendments thereto, is incorporated herein by reference.

TECHNICAL FIELD

The present disclosure relates to the technical field of filtering switches, and in particular, to a dual-band filtering switch based on a single quad-mode dielectric resonator.

BACKGROUND

Dielectric resonator (DR) is widely applied in high-performance filtering designs due to its high quality factor (Q) thereof, power handling and thermal stability, and great potential in mass and volume reductions. In the last decade, various single-mode DR filters have been reported. However, due to the single-mode operation of the DR, a large number of resonators are required, causing large area occupations. Therefore, dual-/multi-mode DRs are investigated for size reduction.

Filter A filter and a switch are two important devices of a time division duplex (TDD) communication system. The filter and the switch are usually designed individually and then cascaded with each other for use, but this would lead to large loss and volume. The filter and the switch may be integrated into a single component, namely a filtering switch, which occupies a smaller area and has lower insertion loss. However, most of the reported filtering switches are limited to single-band operation. To satisfy the requirements of dual-band TDD communication systems, several dual-band filtering switches have been disclosed in the field of printed circuit board (PCB) technology. However, these dual-band filtering switches are all formed by combining two single-band filtering switches at input and output ports thereof via duplex junctions or dual-band transformers. This parallel combination method requires a large number of resonators in the filtering switch, leading to a bulky size. Moreover, in these designs, the ON-states of the switch are obtained when the diodes are turned on. Consequently, the losses from the equivalent resistances of the diodes are introduced into passbands, aggravating the transmission performance. The aforementioned dual-band switches are all designed using planar microstrip structures, thereby suffering from relatively large losses.

Hence, using multi-mode high-Q DRs to design a dual-band filtering switch with both high performance and compact size is much in demand.

SUMMARY OF THE INVENTION

Embodiments of the present disclosure provide a dual-band filtering switch with both high performance and compact structure, to resolve the defects of large losses and/or large volumes of existing dual-band filtering switches.

To address the foregoing technical problems, an embodiment of the present disclosure provides a dual-band filtering switch based on a single quad-mode DR, including:

a first printed circuit board (PCB) provided thereon with an input terminal;

a second PCB provided thereon with an output terminal; wherein the first PCB and the second PCB each includes a respective feeding layer, a respective dielectric layer, as a respective ground layer that are stacked in sequence, the input terminal is electrically connected to the feeding layer of the first PCB, and the output terminal is electrically connected to the feeding layer of the second PCB;

a shielding shell arranged between the first and second PCBs and enclosing a shielding cavity together with the first and second PCBs; and a single quad-mode DR arranged in the shielding cavity, where the feeding layers of the first and second PCBs are both arranged facing the single quad-mode DR, and a feeding structure is formed on each of the feeding layers;

the feeding structure includes two perpendicularly intersecting microstrip lines, and the feeding structure is in contact with a surface of the single quad-mode DR; the first and second PCBs are each provided thereon with four short-circuited pins for connecting four ends of the microstrip lines to the ground layer; and one end of each line of the two perpendicularly intersecting microstrip lines is respectively connected to a switching circuitry, and the respective switching circuitry is configured to control the dual-band filtering switch to be switched between an ON-state for dual-band transmission and an OFF-state for dual-band isolation.

Preferably, the shielding shell includes two sets of opposite side walls, where one set of opposite side walls is arranged in a longitudinal direction, and the other set of opposite side walls is arranged in a transverse direction; and two tuning screws are symmetrically arranged on each of the two sets of opposite side walls, and the tuning screw is configured to tune the frequencies of the resonant modes of the single quad-mode DR.

Preferably, the single quad-mode DR is provided with two holes facing the first and second PCBs respectively, and the holes are cuboid-shaped.

Preferably, a first end of each microstrip line is connected to a respective one of the short-circuited pins through the respective switching circuitry; a second end of each microstrip line is directly electrically connected to one of the short-circuited pins; and the two microstrip lines of the feeding structure perpendicularly intersect at a first intersection point, and are centro-symmetrical with respect to the first intersection point.

Preferably, both the shielding cavity and the single quad-mode DR are cuboid-shaped; a central point of the single quad-mode DR overlaps a central point of the shielding cavity; and the first intersection is located at a central axis of the shielding cavity.

Preferably, the first PCB and the second PCB are the same in structure and shape.

Preferably, the single quad-mode DR is specifically a resonator with four different resonant modes, where two resonant modes of the resonator are used to form a first filtering passband, and the other two resonant modes of the resonator are used to form a second filtering passband.

Preferably, the respective switching circuitry includes: a diode and a bias circuit, where a cathode of the diode is connected to the short-circuited pin, an anode of the diode is connected to a first end of the bias circuit, and a second end of the bias circuit is connected to one end of the microstrip line; where when the diodes are reversely biased, the four resonant modes of the single quad-mode DR are simultaneously excited, so that the dual-band filtering switch is turned on; and when the diodes are forward biased, the four resonant modes of the single quad-mode DR are simultaneously suppressed, so that the dual-band filtering switch is turned off.

Preferably, a slot is provided near an area vertical to the switching circuitry on the ground layer, and the slot is configured to generate a transmission zero required for filtering response.

Preferably, two slots on the first PCB and the second PCB are symmetrical with respect to the center of the single quad-mode DR.

The implementation of the embodiments of the present disclosure has the following beneficial effects: The dual-band filtering switch of the present disclosure achieves high performance in terms of insertion loss and isolation. Furthermore, due to the single quad-mode DR being used, the number of resonators is minimized to exploit the design, leading to compact size. To sum up, making full use of the multi-mode high-Q DRs and the planar feeding structures, the proposed switch features enhanced performance with dual-band operation, miniaturization with the fewest resonators, and easy integration. These features make the proposed switch promising for high-standard multi-band TDD communication systems.

BRIEF DESCRIPTION OF THE DRAWINGS

To describe the technical solutions in the embodiments of the present disclosure or in the prior art more clearly, the following description briefly describes the accompanying drawings required for describing the embodiments or the prior art. Apparently, the accompanying drawings in the following description show merely some embodiments of the present disclosure.

DETAILED DESCRIPTION OF THE EMBODIMENTS

The technical solutions of the embodiments of the present disclosure are clearly and completely described below with reference to the accompanying drawings, where like features are denoted by the same reference labels throughout the drawings and detail description thereof. Apparently, the described embodiments are merely a part rather than all of the embodiments of the present disclosure. All other examples obtained by those of ordinary skill in the art based on the examples of the present disclosure without making inventive efforts shall fall within the scope of protection of the present disclosure.

Figure 1:
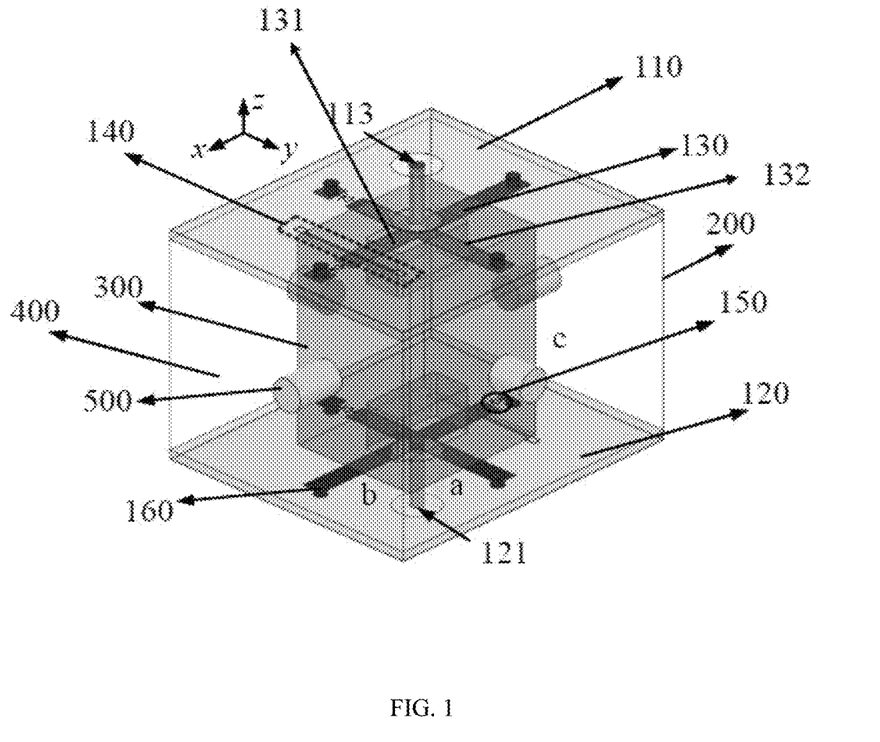
FIG. 1 is a schematic structural diagram of a dual-band filtering switch according to the present disclosure.
Figure 2:
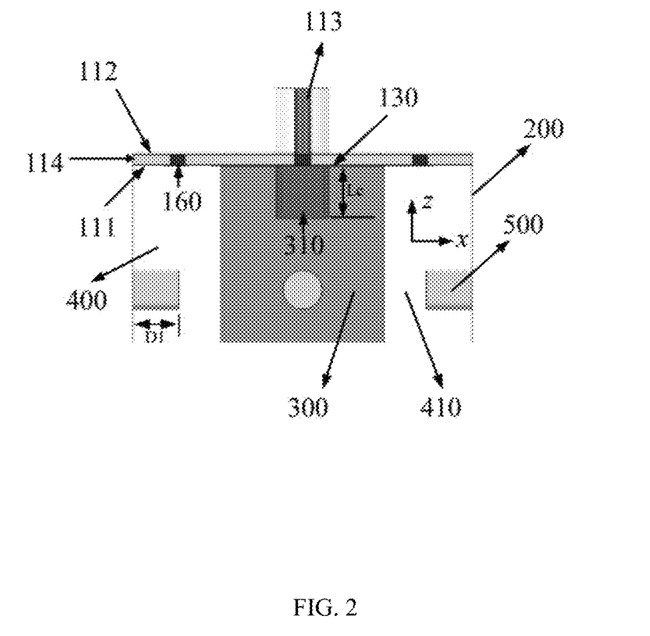
FIG. 2 is a schematic side view of partial structure of a dual-band filtering switch according to the present disclosure.

Referring to FIG. 1 and FIG. 2, a dual-band filtering switch based on a single quad-mode DR includes: a first PCB 110, a second PCB 120 as shown in FIG. 1, a shielding shell 200, and a single quad-mode DR 300.

The first PCB 110 is provided thereon with an input terminal 113. The second PCB 120 is provided thereon with an output terminal 121. The first PCB 110 and the second PCB 120 each includes a feeding layer 111 (FIG. 2), a dielectric layer 114 (FIG. 2), and a ground layer 112 (FIG. 2) that are stacked in sequence. Preferably, the first PCB 110 and the second PCB 120 are the same in structure and shape, that is, the first PCB and the second PCB are also the same in spatial structure, and the first PCB and the second PCB also have the same wiring on the corresponding feeding layers (or ground layers). The input terminal 113 is electrically connected to the feeding layer 111 of the first PCB 110, and the output terminal 121 is electrically connected to the feeding layer 111 of the second PCB 120 (not shown in FIG. 2).

The shielding shell 200 is arranged between the first PCB 110 and the second PCB 120 and encloses a shielding cavity 400 together with the first PCB and the second PCB 120. The single quad-mode DR 300 is arranged in the shielding cavity 400.

The feeding layers 111 of the first PCB 110 and the second PCB 120 are both arranged facing the single quad-mode DR 300, and a feeding structure 130 is formed on each feeding layer 111; the feeding structure 130 includes perpendicularly intersecting microstrip line 1 (with the reference sign 131 as shown in FIG. 1) and microstrip line 2 (with the reference sign 132 as shown in FIG. 1), and the feeding structure 130 is in contact with a surface of the DR 300; the first PCB 110 and the second PCB 120 are each provided thereon with four short-circuited pins 160 for respectively connecting four ends of the microstrip lines to the ground layer 112. For each microstrip line, two short-circuited pins 160 need to be prepared. One end of each line of the two perpendicularly intersecting microstrip lines is respectively connected to a switching circuitry 150 (FIG. 1), and the switching circuitry 150 is configured to control the dual-band filtering switch to be switched between an ON-state for dual-band transmission and an OFF-state for dual-band isolation. The two microstrip lines 131 and 132 of the feeding structure 130 are designed to cross with each other, so that independent control can be achieved between two filtering passbands of the dual-band filtering switch without interfering with each other.

Preferably, a first end of each microstrip line is connected to one short-circuited pin 160 through the switching circuitry 150; a second end of each microstrip line is directly electrically connected to one short-circuited pin 160; and the two microstrip lines of the feeding structure 130 perpendicularly intersect at a first intersection point, and are symmetrical with respect to the first intersection point. The two microstrip lines of the feeding structure 130 are arranged to be centro-symmetrical with respect to the first intersection point, which can improve isolation performance of the dual-band filtering switch.

As shown in FIG. 1 and FIG. 2, further, the shielding shell 200 includes two sets of opposite side walls, where one set of opposite side walls is arranged in a vertical direction, and the other set of opposite side walls is arranged in a horizontal direction; and two tuning screws 500 are symmetrically arranged on each of the two sets of opposite side walls. The tuning screw 500 is configured to tune the frequencies of the resonant modes of the single quad-mode DR 300. Specifically, the shielding shell 200 may be a cuboid, its two sets of side walls correspond to four sides of the cuboid, and the tuning screws 500 are arranged on the centers of the four sides. The tuning screw 500 is screwed into the side wall of the shielding shell 200 and extends into the shielding cavity 400. In an embodiment of the present disclosure, as shown in FIG. 2, there is a gap 410 between the tuning screw 500 and the single quad-mode DR 300.

As shown in FIG. 1, the length a, width b, and height c of the single quad-mode DR 300 are along the x-axis, y-axis, and z-axis, respectively, the single quad-mode DR is provided with two holes 310 (FIG. 2) facing the first PCB 110 and the second PCB 120 respectively, and the holes 310 are cuboid-shaped. The holes 310 are provided to accommodate the solder for electrically connecting the microstrip line and the input terminal. In addition, the depth of the hole 310 can be adjusted to control the frequencies of the resonant modes of the single quad-mode DR 300. A pair of tuning screws 500 is aligned with x-axis, and the other pair of tuning screws 500 is aligned with y-axis. The depth of the screw 500 arranged along the x-axis into the shielding cavity 400 is D1 as shown in FIG. 2.

To further improve isolation performance of the dual-band filtering switch, the shielded cavity 400 and the single quad-mode DR 300 are both cuboid-shaped, and the central point of the single quad-mode DR 300 overlaps the central point of the shielded cavity 400. The first intersection point is located on the central axis of the shielding cavity 400.

Figure 3:
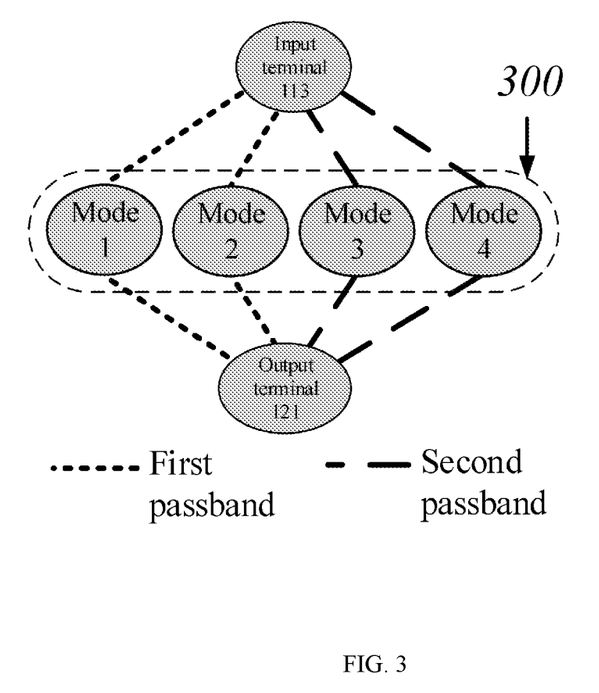
FIG. 3 is a schematic topology diagram of a dual-band filtering switch according to the present disclosure.

Specifically, the single quad-mode DR 300 is a resonator 300 having four different resonant modes from the input terminal 113 to the output terminal 121. As shown in FIG. 3, the first two resonant modes of the resonator 300 are used to form the first filtering passband (hereinafter referred to as the first passband), and the other two resonant modes are used to form the second filtering passband (hereinafter referred to as the second passband). The filtering passband is specifically a frequency range that the dual-band filtering switch allows signals to pass through.

Figure 5:
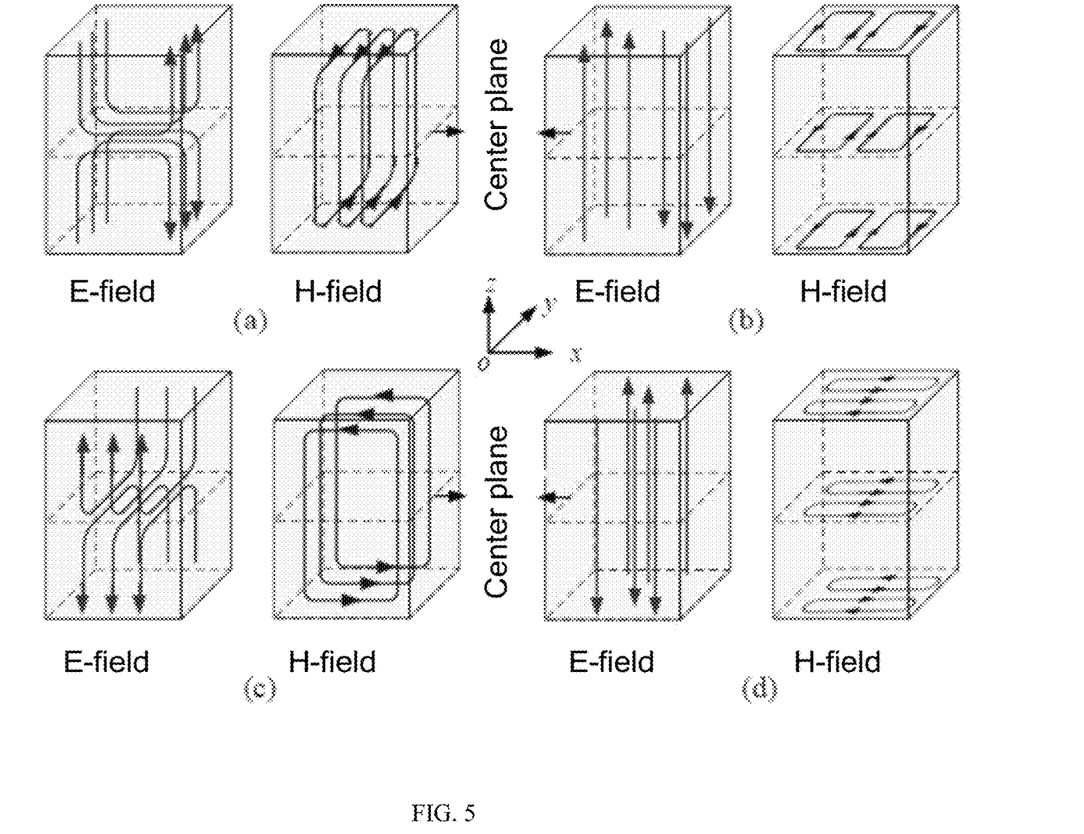
FIG. 5 is a schematic diagram of electric fields and magnetic fields of a DR in (a) Mode 1, (b) Mode 2, (c) Mode 3, and (d) Mode 4 according to the present disclosure.

The four different resonant modes are named modes 1, 2, 3 and 4 herein. The electric fields (E-fields) and magnetic fields (H-fields) of the modes are shown in FIG. 5. For simplicity, the two holes 310 (FIG. 2) are removed since these holes hardly affect the patterns of fields. As observed, Mode 1 and Mode 3 are a pair of degenerate modes and share the similar field distributions. The E-fields of Mode 1 and Mode 3 on the center plane as shown in FIGS. 5(a) and 5(b) are both parallel to the plane. Differently, Mode 2 and Mode 4 are the other pair of degenerate modes and the E-fields of Mode 2 and Mode 4 are perpendicular to the center plane as shown in FIGS. 5(c) and 5(d). More importantly, some commonalities could be found between the two degenerate mode pairs. The E-fields of Mode 1 and Mode 2 vary along the x-axis and the E-fields of Mode 1 and Mode 2 are odd-symmetrical with respect to plane yoz. Besides, the E-fields of Mode 3 and Mode 4 vary along the y-axis and the E-fields of Mode 3 and Mode 4 are odd-symmetrical with respect to plane xoz. Therefore, based on the commonalities and diversities of the above quad-mode fields, the four modes can be adjusted without interference. An adjustment method of the single quad-mode DR is as follows:

Mode 2 of the single quad-mode DR 300 is tuned to its the required position by using the depth Lc of the hole 310 as shown in FIG. 2;

Mode 4 of the single quad-mode DR 300 is tuned by the length a (FIG. 1) of the single quad-mode DR 300 without affecting Mode 2;

Mode 3 of the single quad-mode DR 300 is tuned by the height c (FIG. 1) of the single quad-mode DR 300 without affecting Mode 2 and Mode 4;

Mode 1 of the single quad-mode DR 300 is tuned by the length D1 (FIG. 2) of the tuning screw 500 being stretched into the shielding cavity, without affecting Modes 2, 3, and 4.

In an embodiment of the present disclosure, as shown in FIG. 1, in each feeding structure 130, two microstrip lines 131 and 132 are arranged along the x-axis direction and the y-axis direction, respectively. On the first PCB 110 and the second PCB 120, two switching circuitries 150 connected to ends of the two microstrip lines 131 arranged in the x-axis direction are centrally symmetrical with respect to the single quad-mode DR 300. On the first PCB 110 and the second PCB 120, two switching circuitries 150 connected to ends of the two microstrip lines 132 arranged in the y-axis direction are mirror-symmetrical with respect to the single quad-mode DR 300. It should be understood that there are many arrangements for the switching circuitry 150, and those skilled in the art can also deduce many feasible arrangements under the teaching of this application, which are not limited herein.

Figure 4:
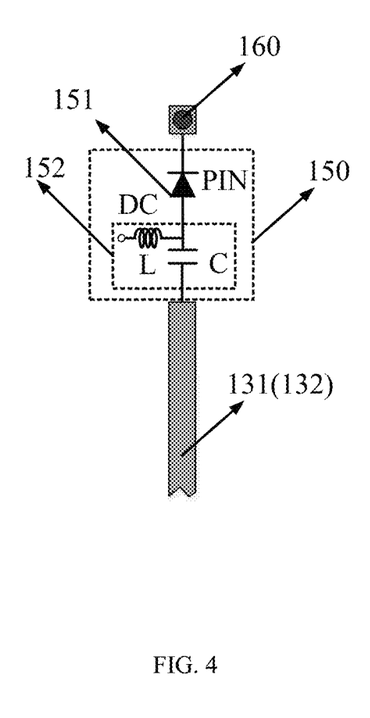
FIG. 4 is a schematic structural diagram of a switching circuitry according to the present disclosure.

Specifically, as shown in FIG. 4, the switching circuitry 150 includes a diode 151 and a bias circuit 152. The diode 151 may specifically be a PIN diode, where the PIN diode refers to a diode in which a layer of intrinsic semiconductor (I layer) is added between an N-type semiconductor and a P-type semiconductor of PN junction diode. The cathode of the diode 151 is connected to the short-circuited pin 160, the anode of the diode 151 is connected to the first end of the bias circuit 152, and the second end of the bias circuit 152 is connected to one end of the microstrip line. Specifically, the bias circuit 152 includes an inductor L and a capacitor C. The first end of the inductor L is connected to the first end of the capacitor C, the first end of the capacitor C is also connected to the anode of the diode 151, the second end of the capacitor C is connected to one end of the microstrip line 131 (132), and the second end of the inductor L is connected to a direct current power supply (DC) during use.

The microstrip line connected with a diode is employed as a switchable feeding structure, which facilitates integration with other actual planar circuits. When the diodes are reversely biased, the four resonant modes of the single quad-mode DR 300 are excited at the same time to achieve the ON-state of the switch. In this manner, no extra losses from the diodes are introduced, leading to low loss transmission. Making full use of quad-mode orthogonality and diversity, the two filtering passbands can be constructed and designed independently for the dual-band filtering switch. Conversely, when the diodes are forward biased, the four resonant modes of the single quad-mode DR 300 can be eliminated simultaneously for the OFF-state of the switch, so that the dual-band filtering switch achieves high dual-band isolation.

Further, a slot 140 (FIG. 1) is provided near an area vertical to the switching circuitry 150 on the ground layer 112, and the slot 140 is configured to generate a transmission zero required for filtering response. In a preferred manner, two slots 140 on the first PCB 110 and the second PCB 120 are centro-symmetrical with respect to the center of the single quad-mode DR 300. In an embodiment of the present disclosure, the slot 140 extends in the y-axis direction. It should be understood that the slot 140 can be arranged in many ways, for example, it can also extend along the x-axis direction, which is not limited herein.

The dual-band filtering switch of the present disclosure achieves high performance in terms of insertion loss and isolation. Furthermore, due to the single quad-mode DR being used, the number of resonators is minimized to exploit the design, leading to compact size. To sum up, making full use of the multi-mode high-Q DRs and the planar feeding structures, the proposed switch features enhanced performance with dual-band operation, miniaturization with the fewest resonators, and easy integration. These features make the proposed switch promising for high-standard multi-band TDD systems.

The following further describes the ON- and OFF-states of the dual-band filtering switch.

ON-State

Figure 6:
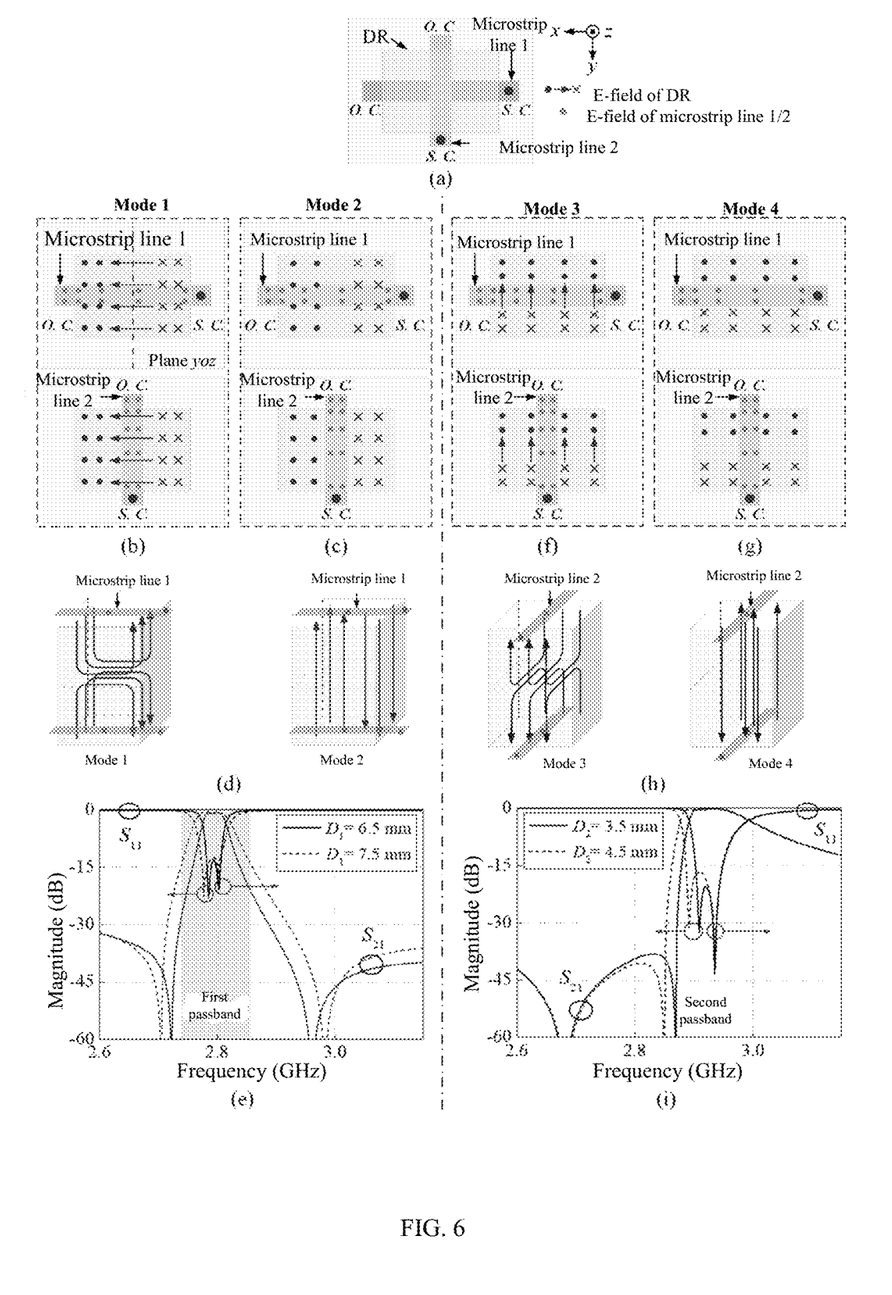
FIG. 6 is a schematic diagram of excitation mechanism of a dual-band filtering switch according to the present disclosure with the diodes reversely biased wherein (a) equivalent feeding structure, (b) excitation of Mode 1, (c) excitation of Mode 2, (f) excitation of Mode 3, (g) excitation of Mode 4, (d) simplified structures with mode 3 and mode 4, (h) simplified structures with mode 3 and mode 4, (e) second-order first passband at 2.8 GHz, and (i) second-order second passband at 2.9 GHz.

For the ON-state, all the four modes should be excited at the same time. Each diode is reversely biased to achieve the ON-state. In this case, each of the horizontal and vertical parts of the feeding structure are short circuited (S. C.) at one end and open circuited (O. C.) at the other end as shown in FIG. 6(*a*), to simultaneously excite the four modes and form the two passbands. The following describes in detail mechanisms for quad-mode excitation and dual-band construction.

As shown in FIG. 3, Mode 1 and Mode 2 are used to construct the first passband. FIG. 6(*b*) and FIG. 6(*c*) show excitation mechanisms of these two modes, respectively. In FIG. 6(*b*), one end of the microstrip line 1 is equivalent to open-circuited (O. C.), and the other end is equivalent to short-circuited (S. C.). In this case, its E-field is also shown in FIG. 6(*b*). Based on the asymmetrical E-field of the microstrip line 1 and the odd-symmetrical E-field of Mode 1, coupling between Mode 1 and the asymmetrical microstrip line 1 is calculated as non-zero, so Mode 1 can be excited by the asymmetrical microstrip line 1. In addition, because the E-fields of Mode 1 and the microstrip line 2 are perpendicular to each other, the microstrip line 2 does not excite or affect Mode 1. In other words, the microstrip line 2 has no effect on the excitation and manipulation of Mode 1, and only the microstrip line 1 has this effect. Similarly, for Mode 2, based on FIG. 6(*c*), only the microstrip line 1 has the excitation and feeding effect. To sum up, Mode 1 and Mode 2 can be fed by only the microstrip line 1.

Based on the above analysis, FIG. 6(*d*) shows simplified structures with Mode 1 and Mode 2. Mode 1 and Mode 2 are excited simultaneously by using the microstrip line 1, to form the first passband. Therefore, FIG. 6(*e*) shows a magnitude (dB) vs. Frequency (GHz) response for a second-order first passband at 2.8 GHz for different depths $D_2$.

Similarly, for Mode 3 and Mode 4, according to FIG. 6(*f*) and FIG. 6(*g*), the microstrip line 1 in the feeding structure can be ignored, and only the microstrip line 2 needs to be considered. FIG. 6(*h*) shows corresponding simplified structures. Specifically, Mode 3 and Mode 4 are excited simultaneously by using the microstrip line 2, to form the second passband. Therefore, FIG. 6(*i*) shows a magnitude (dB) vs. Frequency (GHz) response for a second-order second passband at 2.9 GHz for different depths $D_2$. In short, the complete structure in FIG. 1 is realized by combining the structures in FIG. 6(*d*) and FIG. 6(*h*). In other words, when the diodes are reversely biased, all the four modes are excited at the same time to obtain a dual-band filtering response. In addition, the two passbands can be independently generated and controlled by making full use of quad-mode orthogonality, which helps simplify the design.

OFF-State

Figure 7:
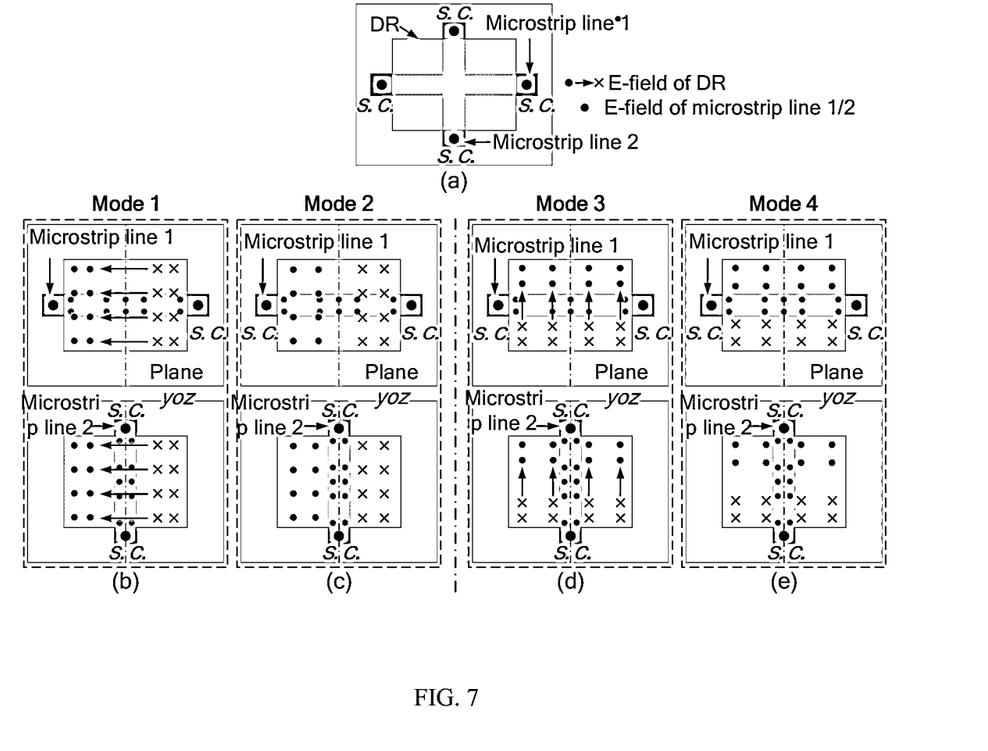
FIG. 7 is a schematic diagram of elimination mechanism of a dual-band filtering switch according to the present disclosure with the diodes forward biased wherein (a) equivalent feeding structure, (b) elimination of Mode 1, (c) elimination of Mode 2, (d) elimination of Mode 3, and (e) elimination of Mode 4.

On the contrary, for the OFF-state, all the four modes should be eliminated at the same time. Herein, all diodes are forward biased to construct the OFF-state. Correspondingly, the feeding structure is regarded as short-circuited (S. C.) at all its four ends, as shown in FIG. 7(*a*). FIGS. 7(*b*), 7(*c*), 7(*d*) and FIG. 7(*e*) show the E-fields of the four modes, the microstrip line 1 and the microstrip line 2 in this case. It can be seen that the microstrip line 1 is regarded as short-circuited at its two ends, and its E-fields are even-symmetrical. Cooperating with the odd-symmetrical E-field of Mode 1, the coupling between Mode 1 and the microstrip line 1 is calculated as zero. Similarly, based on the E-fields of the four modes and the microstrip lines 1 and 2, the couplings between the four modes and the microstrip lines 1 and 2 are all zero.

This means that none of the four modes can be excited by horizontal or vertical components of the feeding structure. In summary, when the diodes are forward biased, all the four modes are suppressed at the same time and then high dual-band isolation of the switch is realized.

Figure 8:
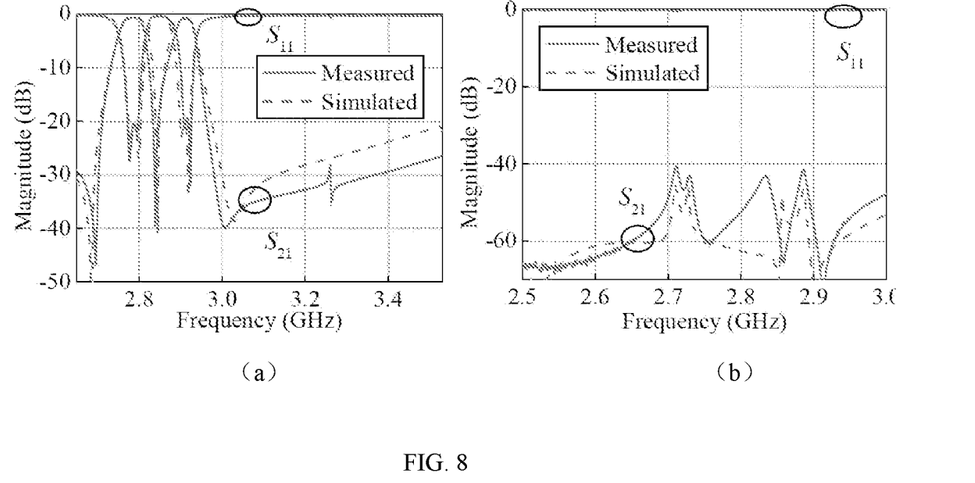
FIG. 8 is a schematic diagram of simulated and measured results of a dual-band filtering switch according to the present disclosure wherein (a) simulated and measured results of the ON-state of the dual-band filtering switch, (b) simulated and measured results of the OFF-state of the dual-band filtering switch.

FIGS. 8(*a*) and 8(*b*) show the simulated and measured results of the ON-state and OFF-state of the dual-band filtering switch, respectively. As shown in FIG. 8(*a*), the filtering switch is turned on, the two passbands are located at 2.8 GHz and 2.9 GHz, and the insertion losses $S_{11}$ are 0.59 dB and 0.63 dB, respectively. Return losses $S_{21}$ better than 20 dB are ensured in both two bands. Besides, three transmission zeros are observed in the lower, middle, and upper stopbands, improving the selectivity. Then the out-of-band rejection below −27 dB is maintained up to 3.5 GHz. For the OFF-state, the isolations at the two center frequencies are 45 dB and 63 dB, respectively, as shown in FIG. 8(*b*). Furthermore, the isolation higher than 41 dB is achieved within the concerned frequency range. Overall, by using only one quad-mode DR, low loss transmission and high selectivity of ON-state and high level rejection for the OFF-state are all realized with miniaturized size.

The above disclosed is only preferred embodiments of the present disclosure, and definitely should not be used to limit the scope of the claims of the present disclosure. A person of ordinary skill in the art can understand all or some of the procedures for implementing the foregoing embodiments and make equivalent changes according to the claims of the present disclosure. The equivalent changes still fall within the scope of the present disclosure.

What is claimed is:

1. A dual-band filtering switch based on a single quad-mode dielectric resonator (DR), comprising:
   a first printed circuit board (PCB) provided thereon with an input terminal;
   a second PCB provided thereon with an output terminal, wherein the first PCB and the second PCB each comprise a respective feeding layer, a respective dielectric layer, and a respective ground layer that are stacked in sequence, the input terminal is electrically connected to the feeding layer of the first PCB, and the output terminal is electrically connected to the feeding layer of the second PCB;

a shielding shell arranged between the first and second PCBs and enclosing a shielding cavity together with the first and second PCBs; and a single quad-mode DR arranged in the shielding cavity; wherein the feeding layers of the first and second PCBs are both arranged facing the single quad-mode DR, and a respective feeding structure is formed on each of the respective feeding layers; the respective feeding structure comprises two perpendicularly intersecting microstrip lines, and the feeding structure is in contact with a respective surface of the single quad-mode DR; the first and second PCBs are each provided thereon with four short-circuited pins for connecting four ends of the microstrip lines to the respective ground layer; and one end of each line of the two perpendicularly intersecting microstrip lines is respectively connected to a respective switching circuitry, and the switching circuitry is configured to control the dual-band filtering switch to be switched between an ON-state for dual-band transmission and an OFF-state for dual-band isolation.

2. The dual-band filtering switch according to claim 1, wherein the shielding shell comprises two sets of opposite side walls, wherein one set of opposite side walls is arranged in a vertical direction, and the other set of opposite side walls is arranged in a horizontal direction; and two tuning screws are symmetrically arranged on each of the two sets of opposite side walls, and the tuning screws are configured to tune the frequencies of resonant modes of the single quad-mode DR.

3. The dual-band filtering switch according to claim 1, wherein the single quad-mode DR is provided with two holes facing the first and second PCBs respectively, and the holes are cuboid-shaped.

4. The dual-band filtering switch according to claim 1, wherein a first end of each microstrip line is connected to one of the short-circuited pins through the respective switching circuitry; a second end of each microstrip line is directly electrically connected to a respective one of the short-circuited pins; and the two microstrip lines of the feeding structure perpendicularly intersect at a first intersection point, and are centro-symmetrical with respect to the first intersection point.

5. The dual-band filtering switch according to claim 4, wherein both the shielding cavity and the single quad-mode DR are cuboid-shaped; a central point of the single quad-mode DR overlaps a central point of the shielding cavity; and the first intersection point is located at a central axis of the shielding cavity.

6. The dual-band filtering switch according to claim 1, wherein the first PCB and the second PCB are the same in structure and shape.

7. The dual-band filtering switch according to claim 1, wherein the single quad-mode DR is specifically a resonator with four different resonant modes, wherein two resonant modes of the four resonant modes of the resonator are used to form a first filtering passband, and the other two resonant modes of the four resonant modes are used to form a second filtering passband.

8. The dual-band filtering switch according to claim 7, wherein the respective switching circuitry comprises: a diode and a bias circuit, wherein a cathode of the diode is connected to the respective short-circuited pin, an anode of the diode is connected to a first end of the bias circuit, and a second end of the bias circuit is connected to one end of the respective microstrip line; wherein when the respective diodes are reversely biased, the four resonant modes of the single quad-mode DR are simultaneously excited, so that the dual-band filtering switch is turned on; and when the respective diodes are forward biased, the four resonant modes of the single quad-mode DR are simultaneously suppressed, so that the dual-band filtering switch is turned off.

9. The dual-band filtering switch according to claim 1, wherein a slot is provided on the respective ground layer near an area vertical to the respective switching circuitry on the ground layer, and the slot is configured to generate a transmission zero required fora filtering response.

10. The dual-band filtering switch according to claim 1, wherein the first PCB and the second PCB each comprises two respective slots, the two respective slots on the first PCB and the two respective slots on the second PCB are symmetrical with respect to the center of the single quad-mode DR.

* * * * *